United States Patent
Poon et al.

(10) Patent No.: US 6,917,412 B2
(45) Date of Patent: Jul. 12, 2005

(54) MODULAR STAGE WITH REACTION FORCE CANCELLATION

(75) Inventors: Alex Ka Tim Poon, San Ramon, CA (US); Leonard Wai Fung Kho, San Francisco, CA (US); Pai-Hsueh Yang, Palo Alto, CA (US); Ping-Wei Chang, San Jose, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/375,785

(22) Filed: Feb. 26, 2003

(65) Prior Publication Data

US 2004/0165172 A1 Aug. 26, 2004

(51) Int. Cl.$^7$ .................. G03B 27/58; G03B 27/42; G03B 27/62; G03B 27/32
(52) U.S. Cl. ................ 355/72; 355/53; 355/75; 355/77
(58) Field of Search ................ 355/72, 53, 75, 355/77; 356/399, 400, 401; 310/12, 53; 318/34, 38, 687; 250/492.2

(56) References Cited

U.S. PATENT DOCUMENTS

| | | | |
|---|---|---|---|
| 6,028,376 A | * | 2/2000 | Osanai et al. ............ 310/12 |
| 6,084,673 A | | 7/2000 | Van Den Brink et al. .. 356/358 |
| 6,194,859 B1 | | 2/2001 | Everman et al. ......... 318/568.2 |
| 6,396,566 B2 | * | 5/2002 | Ebinuma et al. ............. 355/53 |

FOREIGN PATENT DOCUMENTS

JP          11-274273          10/1999

\* cited by examiner

Primary Examiner—Peter B. Kim
(74) Attorney, Agent, or Firm—Ritter, Lang & Kaplan LLP

(57) ABSTRACT

Methods and apparatus for providing a stage apparatus which is modular and allows for reaction force cancellation are described. According to one aspect of the present invention, a stage apparatus includes a table assembly and a first stage. The table assembly supports an object, e.g., a wafer or a reticle, which is to be moved. The first stage includes a counter mass arrangement, a plurality of carriages, and a plurality of linkages. The plurality of carriages is coupled to the table assembly through the plurality of linkages such that a first carriage and a second carriage are arranged to move in substantially opposite directions along a first axis to cause the table assembly to move along a second axis while reaction forces generated when the first carriage and the second carriage are substantially cancelled by the counter mass arrangement.

45 Claims, 14 Drawing Sheets

MODULAR STAGE WITH REACTION FORCE CANCELLATION

BACKGROUND OF THE INVENTION

1. Field of Invention

The present invention relates generally to semiconductor processing equipment. More particularly, the present invention relates to a modular stage device that provides reaction force cancellation, allows the center of gravity of components of the stage device to remain substantially unchanged during operation, and is both readily accessible and serviceable.

2. Description of the Related Art

For precision instruments such as photolithography machines which are used in semiconductor processing, factors which affect the performance, e.g., accuracy, of the precision instrument generally must be dealt with and, insofar as possible, eliminated. When the performance of a precision instrument is adversely affected, as for example by pitching moments, products formed using the precision instrument may be improperly formed and, hence, function improperly. For instance, a photolithography machine that is subjected to pitching moments may cause an image projected by the photolithography machine to move, and, as a result, be aligned incorrectly on a projection surface such as a semiconductor wafer surface.

Scanning stages such as wafer scanning stages and reticle scanning stages are often used in semiconductor fabrication processes, and may be included in various photolithography and exposure apparatuses. Wafer scanning stages are generally used to position a semiconductor wafer such that portions of the wafer may be exposed as appropriate for masking or etching. Reticle scanning stages are generally used to accurately position a reticle or reticles for exposure over the semiconductor wafer. Patterns are generally resident on a reticle, which effectively serves as a mask or a negative for a wafer. When a reticle is positioned over a wafer as desired, a beam of light or a relatively broad beam of electrons may be collimated through a reduction lens, and provided to the reticle on which a thin metal pattern is placed. Portions of a light beam, for example, may be absorbed by the reticle while other portions pass through the reticle and are focused onto the wafer.

FIG. 1 is a diagrammatic representation of a conventional stage apparatus, e.g., a wafer scanning stage apparatus. A stage apparatus 100 includes a coarse stage 104 which is arranged to scan in a y-direction 128. Coarse stage 104, which may carry a wafer table (not shown) positioned atop a fine stage (not shown), is coupled to coils 108 which are arranged to cooperate with magnet tracks 112 to drive coarse stage 104. Specifically, coil 108a and magnet track 112a are positioned on one side of coarse stage 104 while coil 108b and magnet track 112b are positioned on an opposite side of coarse stage 104.

Reaction forces generated by motors which include coils 108 and magnet tracks 112 are effectively guided to a grounding surface 116.

Typically, reaction forces generated by motors (not shown) which allow coarse stage 104 to be scanned in an x-direction 120 are also absorbed by a grounding surface such as grounding surface 116. When differential movement of coil 108a and coil 108b, e.g., when coil 108a and coil 108b are not scanned at the same velocity, allows for rotational motion of coarse stage 104 about a z-direction 124, reaction forces generated from such movement may also be absorbed by a grounding surface such as grounding surface 116.

Although a stage apparatus such as stage apparatus 100 is generally effective in enabling a wafer (not shown) positioned atop coarse stage 104 to be positioned, such a stage apparatus may be both difficult to access and difficult to service. That is, since coils 108 are located on both sides of coarse stage 104, the design of stage apparatus 100 is such that a debugging process to isolate problems with stage apparatus 100 is relatively time consuming. By way of example, testing scanning capabilities in y-direction 128 is generally not possible unless stage apparatus 100 is substantially completely built. To correct problems observed when scanning capabilities in y-direction 128 are tested, substantially all of stage apparatus 100 may need to be dismantled. Hence, the accessibility and the serviceability, e.g., maintainability, of stage apparatus 100 may be somewhat lacking.

Therefore, what is needed is a method and an apparatus for enabling a stage apparatus which is relatively accessible and relatively serviceable, while being capable of operating such that disturbances within the stage apparatus are substantially minimized. In other words, what is desired is a stage apparatus which is relatively modular, and has a stage which may be driven through its center of gravity in order to minimize disturbances within the stage apparatus.

SUMMARY OF THE INVENTION

The present invention relates to stage apparatus which is modular and provides for reaction force cancellation. According to one aspect of the present invention, a stage apparatus includes a table assembly and a first stage. The table assembly supports an object, e.g., a wafer or a reticle, that is to be moved. The first stage includes a counter mass arrangement, a plurality of carriages, and a plurality of linkages. The plurality of carriages is coupled to the table assembly through the plurality of linkages such that a first carriage and a second carriage are arranged to move in substantially opposite directions along a first axis to cause the table assembly to move along a second axis while reaction forces generated when the first carriage and the second carriage are substantially cancelled by the counter mass arrangement.

In one embodiment, the stage apparatus also includes a second stage that carries the first stage. The second stage is arranged to cause the first stage to scan along the second axis to cause the table assembly to move along the second axis by substantially driving the first stage through a center of gravity of the first stage. In such an embodiment, the stage apparatus may also include a first counter mass that substantially supports the second stage and substantially absorbs reaction forces generated when the second stage causes the first stage to scan along the second axis.

A stage device in which both actuators or motors which allow a table assembly to scan along a y-axis are positioned on a same side of the table assembly enables the stage device to be relatively easily maintained. In other words, the serviceability and accessibility of a modular stage device is relatively high. A modular stage device may also be arranged such that the table assembly, e.g., wafer table, and each stage of the stage device may be driven through its appropriate center of gravity, which may be arranged to remain in substantially the same position throughout the operation of the stage device. By driving each stage or table through its center of gravity, disturbances within the stage device may be reduced, thereby allowing for improved performance, e.g., accuracy, of the stage device. The disturbances may further be reduced or cancelled by incorporating counter masses into the stage device which enable reaction forces to be absorbed.

According to another aspect of the present invention, a scanning stage device includes a table that supports an object, a fine stage assembly, and a coarse stage assembly. The fine stage assembly is arranged to carry the table, and the coarse stage assembly includes a first stage and a second stage. The first stage includes a first carriage and a second carriage that are coupled to the fine stage assembly through a plurality of linkages. The second stage substantially supports the first stage and moves the first stage along a first axis through approximately a center of gravity of the first stage to move the fine stage assembly along the first axis. The first carriage and the second carriage are arranged to be driven in substantially opposite directions along the first axis to move the fine stage assembly along a second axis. In one embodiment, the first stage includes a first magnet track, and the first carriage and the second carriage are arranged to scan over the first magnet track.

According to still another aspect of the present invention, a method of positioning an object that is supported by a table assembly of a stage device which is coupled to a first actuator and a second actuator that are included on a first stage of the stage device involves determining when the object is to be moved along a first axis, and driving the first actuator and the second actuator in substantially opposite directions along a second axis to move the object along the first axis when it is determined that the object is to be moved along the first axis. The method also includes determining when the object is to be moved along the second axis, and driving the first stage device along the second axis to move the object along the second axis when it is determined that the object is to be moved along the second axis.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

Many stage devices, while effective in enabling an object such as a wafer to be scanned, are relatively difficult to maintain, since the stage devices are built in an integrated manner such that debugging one aspect of the stage device may require disassembling portions of the stage device which are associated with a different aspect of the stage device. In other words, components of many stage devices are often not readily accessible or serviceable. For example, in some conventional stage devices, when components used to enable a stage to scan in a y-direction are to be tested, such components generally may not be tested unless components associated with enabling the stage to scan in an x-direction are in place within the stage devices. As such, a debugging process associated with a scan in the y-direction may become relatively complicated.

A stage device which is relatively uncomplicated to access and to service may be manufactured as a modular system. That is, a stage device which is manufactured such that various components of the stage device may be relatively easily decoupled from other components is typically easy to access and to service or maintain. Further, when substantially all motors or actuators in such a stage device are positioned to be on one side of a wafer table, the maintenance of the actuators may be relatively easy, the actuators are readily accessible.

In one embodiment, a modular stage device which is arranged to include actuators that are all substantially on one side of a wafer table uses a plurality of linkages to move or scan the wafer table. Such a modular stage device may be arranged such that the wafer table and each stage of the stage device may be driven through its appropriate center of gravity, which may be arranged to remain in substantially the same position throughout the operation of the stage device. By driving each stage or table through its center of gravity, disturbances within the stage device may be reduced, thereby allowing for improved performance, e.g., accuracy, of the stage device. The disturbances may further be reduced by adding a counter mass assembly which enables reaction forces to be absorbed.

Figure 1:
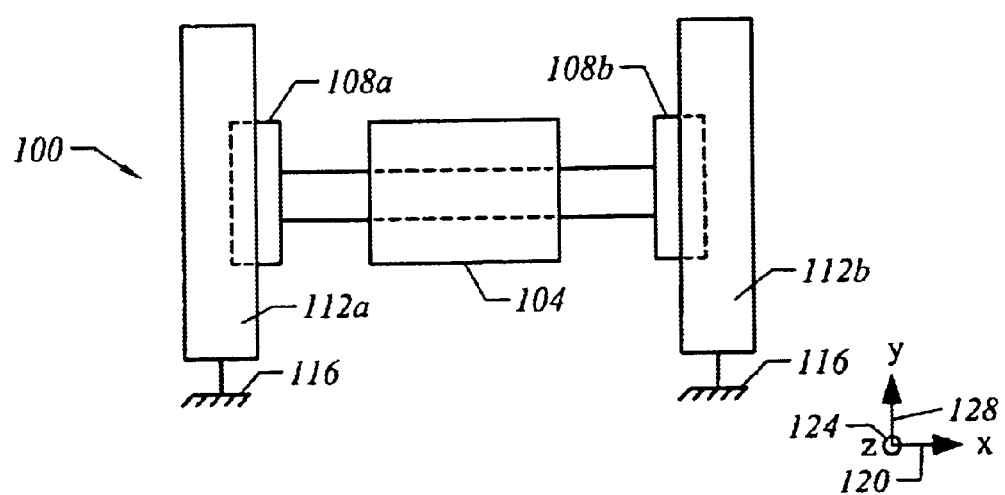
FIG. 1 is a diagrammatic representation of a conventional stage apparatus, e.g., a wafer scanning stage apparatus.
Figure 2:
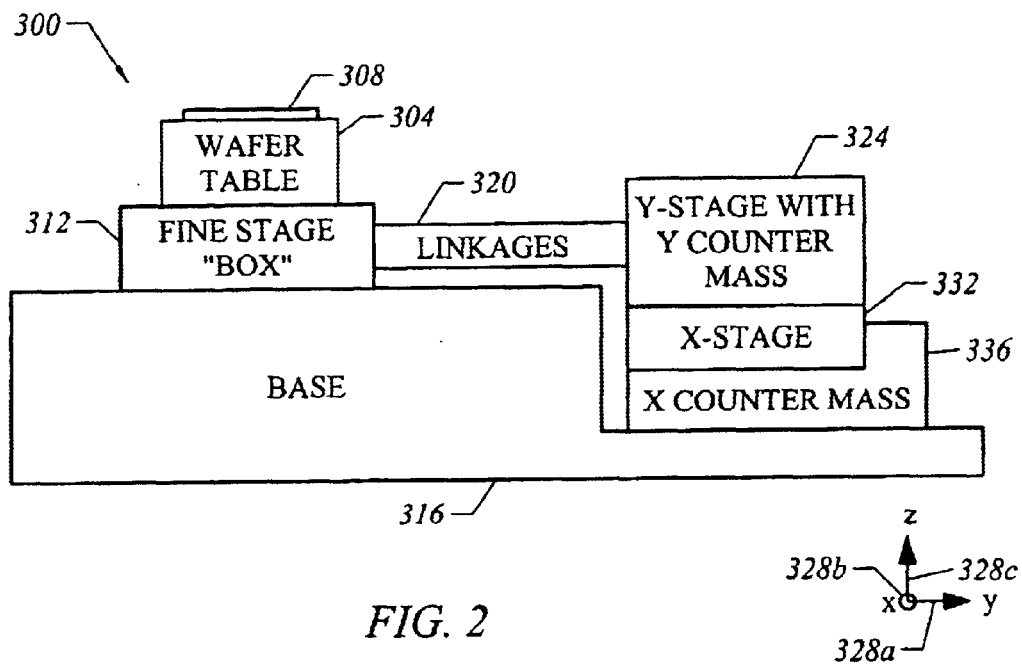
FIG. 2 is a diagrammatic block diagram representation of a stage device in accordance with an embodiment of the present invention.

FIG. 2 is a diagrammatic block diagram representation of a stage device in accordance with an embodiment of the present invention. A stage device 300 includes a wafer table 304 which is arranged to support a wafer 308. In the described embodiment, fine movements, e.g., high bandwidth movements, are provided to wafer 308 by a fine stage "box" 312 which includes substantially any suitable fine stage mechanism. Fine stage box 312 is arranged to be positioned atop a base 316 such that a fine stage associated with fine stage box 312 may slide over base 316. Fine stage box 312 may be situated atop air bearings (not shown) in order to enable fine stage box 312 to translate and to rotate.

Fine stage box 312 is linked through linkages 320 to a y-stage 324 which includes a y-counter mass that is arranged to absorb reaction forces generated when y-stage 324 or a portion of y-stage causes wafer table 304 to move. Y-stage 324 is arranged to enable wafer table 304 to move in a y-direction 328a by causing linkages 320 to move, as will be discussed below with reference to FIGS. 4a and 4b. It should be appreciated that to move wafer table 304, linkages 320 also move fine stage box 312. Typically, linkages 320 are coupled between actuators (not shown) of y-stage 324 and fine stage box 312. Y-stage 324 is also arranged to impart relatively coarse movements on wafer table 304 to enable wafer table 304 to translate in an x-direction 328b.

When y-stage 324 moves, y-stage 324 is effectively guided by an x-stage 332. Typically, x-stage 332 includes guides (not shown) which allows y-stage 324 to move in x-direction 328b, and also includes trim motors (not shown) which are arranged to enable a center of mass of stage device 300 to be maintained near a desired or expected position.

In lieu of using y-stage 324 to provide movement of wafer table 304 in x-direction 328b, an x-stage 332 may be used to enable fine stage box 312 to move in x-direction 328b by also moving y-stage 324 and, hence linkages 320 in x-direction 328b, as will be discussed below with reference to FIG. 4c. An x-counter mass 336 absorbs reaction forces associated with enabling x-stage 332 to move, e.g., coarsely, in x-direction 328b. X-stage 332 is generally driven in x-direction 328b through it center of gravity. In one embodiment, trim motors (not shown) included on x-counter mass 336 enable rotational motion, e.g., a relatively coarse rotational motion, to be controlled about a z-axis 328c such that reaction forces for such motion are absorbed by x-counter mass 336.

Figure 3:
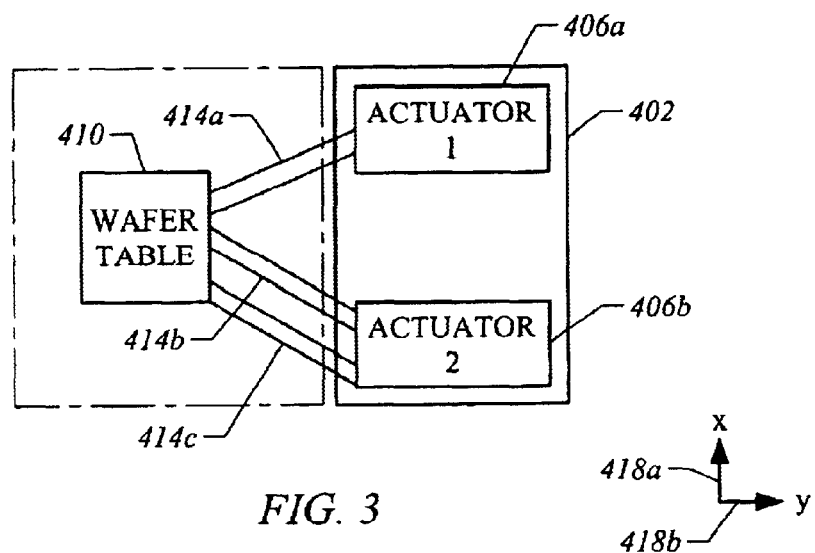
FIG. 3 is a diagrammatic top-view block diagram representation of a configuration of linkages and a configuration of actuators of a y-stage in a first orientation in accordance with an embodiment of the present invention.

Typically, y-stage 324 includes two actuators which may be moved in substantially opposite directions to effectively force linkages 320 to push or pull wafer table 304 in y-direction 328a. With reference to FIG. 3, a configuration of linkages and a configuration of actuators of a y-stage will be described in accordance with an embodiment of the present invention. A y-stage 402 includes a first actuator 406a and a second actuator 406b. While actuators 406 each have their own coils, actuators 406 are arranged in one embodiment to share a single magnet track (not shown) such that actuators 406 may move substantially independently over the shared magnet track.

First actuator 406a is coupled to a wafer table 410 through a linkage 414a. It should be appreciated that, in general, the substantially indirect coupling between linkage 414a and wafer table 410 involves coupling linkage 414a to a fine stage mechanism (not shown), and coupling the fine stage mechanism to wafer table 410. Second actuator 406b is coupled to wafer table 410 through linkages 414b, 414c. The use of three linkages 414 to couple actuators 406 to wafer table 410 typically prevents the overall system which includes y-stage 402, linkages 414, and wafer table 410 from being either over-constrained or under-constrained.

Figure 4A:
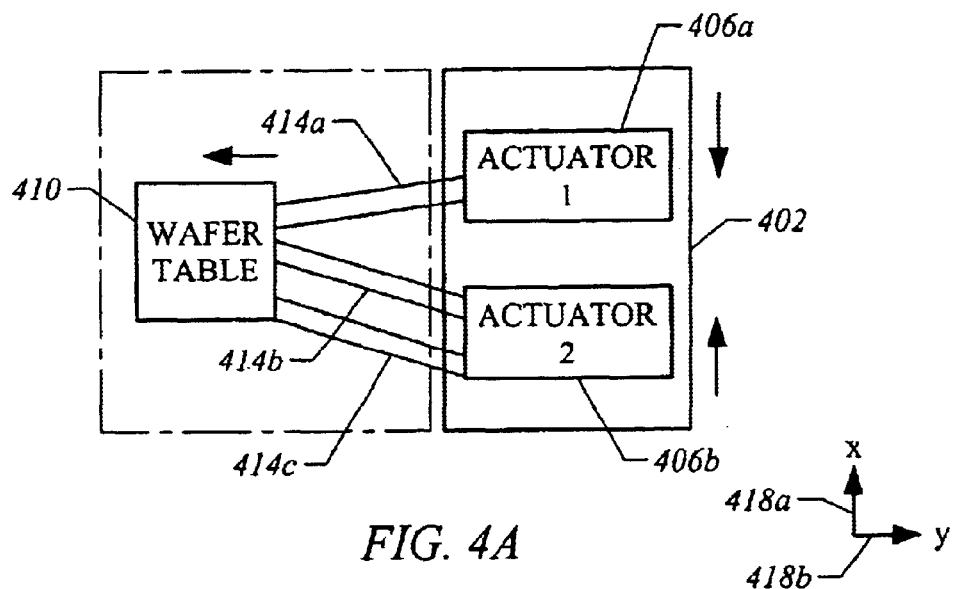
FIG. 4a is a diagrammatic top-view block diagram representation of a configuration of linkages and a configuration of actuators of a y-stage, e.g., linkages 414 and actuators 406 of FIG. 3, in a second orientation in accordance with an embodiment of the present invention.

In order for wafer table 410 to be moved with respect to a y-axis 418b, actuators 406 are actuated or otherwise moved in substantially opposite directions with respect to an x-axis 418a. As shown in FIG. 4a, when first actuator 406a and second actuator 406b are effectively moved towards each other along x-axis 418a, linkages 414 move such that wafer table 410 is moved in a negative direction along y-axis 418b, i.e., such that wafer table 410 is pushed away from actuators 406. Similarly, when first actuator 406a and second actuator 406b move in opposite directions along x-axis 418a, linkages 414 move such that wafer table 410 move in a positive direction with respect to y-axis 418b and, hence, may move from the position shown in FIG. 4a to the position shown in FIG. 3. As actuators 406 move along x-axis 418a in opposite directions, a center of gravity of an overall device which includes y-stage 402, table 410, and linkages 414 may remain in substantially the same position, which effectively minimizes disturbances on an overall system.

Generally, driving actuators 406 or motors perpendicular to a desired direction of travel, e.g., driving actuators 406 along x-axis 418a to cause wafer table 410 to move along y-axis 418b, causes a reaction force to be generated in the same direction as the motion. In other words, when actuators 406 are driven along x-axis 418a to cause wafer table 410 to move along y-axis 418b, a reaction force is generated along y-axis 418b in a direction that is substantially opposite to the direction in which wafer table 410 moves. To allow such a reaction force to be absorbed and, hence, substantially prevent the reaction force form adversely affecting the performance of an overall stage, y-stage 402 includes a counter mass (not shown) that absorbs the reaction force, as will be discussed below.

The amount by which actuators 406 move in order to cause wafer table 410 to move a certain amount along y-axis 418b is dependent, at least in part, upon a mass ratio of y-stage 402, which includes a y-counter mass, to wafer table 410 or, more specifically, a wafer table assembly which may include wafer table 410 and a fine stage mechanism (not shown) that is coupled to wafer table 410 and adjusts position of wafer table 410 in up to six degrees of freedom.

Typically, to substantially minimize the stroke needed for actuators 406 to move wafer table 410 a desired amount, a higher ratio between the mass of y-stage 402 to the mass of a wafer table assembly which includes wafer table 410 is desired. However, a higher mass of y-stage 402 may render it more difficult to drive y-stage 402. Hence, a mass ratio in the range of between approximately six to one and approximately ten to one may enable the stroke of actuators 406 to be minimized without adding too much mass to y-stage 402.

Figure 4B:
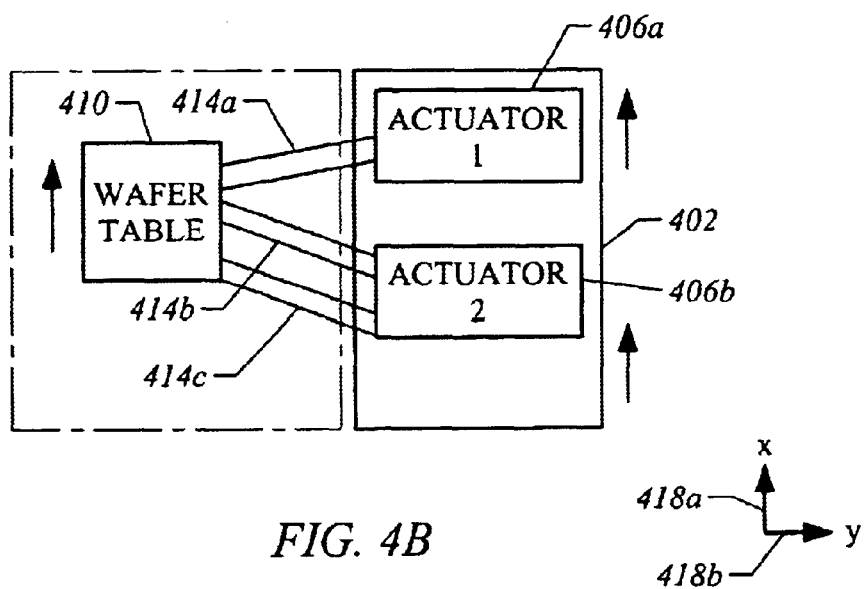
FIG. 4b is a diagrammatic top-view block diagram which representation illustrates the movement of actuators, e.g., actuators 406 of FIG. 4a, in the same direction along an axis in accordance with an embodiment of the present invention.

As previously mentioned, both actuators 406 may move or translate in the same direction along x-axis 418a such that wafer table 410 moves in the same direction as both actuators 406 along x-axis 418a. FIG. 4b is a diagrammatic top-view block diagram which illustrates the movement of actuators, e.g., actuators 406 of FIG. 4b, in the same direction along an axis in accordance with an embodiment of the present invention. When actuators 406 are both moved in along x-axis 418a in substantially the same direction, wafer table 410 also translates along x-axis 418a in the same direction.

While driving actuators 406 along x-axis 418a allows wafer table 410 to be moved along x-axis 418a, the use of actuators 406 to move wafer table 410 along x-axis 418a may effectively require that a magnet track over which actuators 406 move have a relatively long length to accommodate a full range of desired motion. In some embodiments, having a relatively long magnet track and, hence y-stage 402 may not be practical, as an increased length may introduce undesirable resonance modes into y-stage 402. Further, driving actuators 406 along x-axis typically causes a center of gravity of y-stage 402 to be shifted, and may introduce moments into y-stage 402.

By driving y-stage 402 along x-axis 418a to move wafer table 410 along x-axis 418a, y-stage 402 is effectively driven through its center of gravity, thereby reducing rotating moments experienced by y-stage 402. Additionally, the size of a magnet track (not shown) on y-stage 402 may be reduced when wafer table 410 is translated along x-axis 418a by driving y-stage 402 along x-axis 418a using an x-stage (not shown). In one embodiment, after y-stage 402 is driven along x-axis 418a using an x-stage (not shown), actuators 406 may be driven in the same direction along x-axis 418a to provide some tuning of the location of wafer table 410 with respect to x-axis 418a.

Figure 4C:
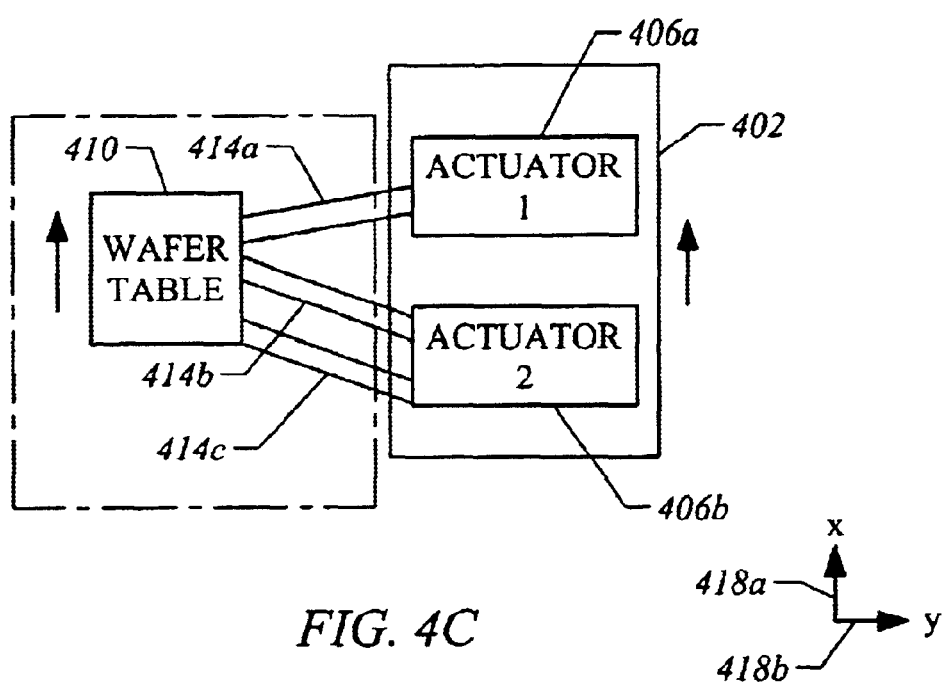
FIG. 4c is a diagrammatic top-view block diagram representation of a y-stage, e.g., y-stage 402 of FIG. 3, which is driven along an x-axis in accordance with an embodiment of the present invention.

FIG. 4c is a diagrammatic top-view block diagram representation of a y-stage, e.g., y-stage 402 of FIG. 3, which is driven along an x-axis in accordance with an embodiment of the present invention. When y-stage 402 is translated along x-axis 418a, linkages 414 which are coupled to actuators 406 of y-stage 402 generally enable wafer table 410 to move along x-axis 418a in the same direction as y-stage 402.

In general, the position of wafer table 410 is at least partially dependent upon the relative motion of actuators 406. As discussed above, when actuators 406 move in the same direction along x-axis 418a, wafer table 410 moves along x-axis 418a. Alternatively, when actuators 406 move in opposite locations along x-axis 418a, then wafer table 410 moves along y-axis 418b. It should be appreciated that wafer table 410 may generally move along both x-axis 418a and y-axis 418b substantially simultaneously, depending upon the relative motion of actuators 406. That is, actuators 406 may also be used to enable wafer table 410 to move along both x-axis 418a and y-axis 418b at substantially the same time. By way of example, if actuator 406a moves a relatively large amount in a first direction along x-axis 418a while actuator 406b moves a relatively small amount in a second direction along x-axis 418a, then wafer table 410 generally moves along x-axis 418a and y-axis 418b substantially simultaneously.

Figure 5:
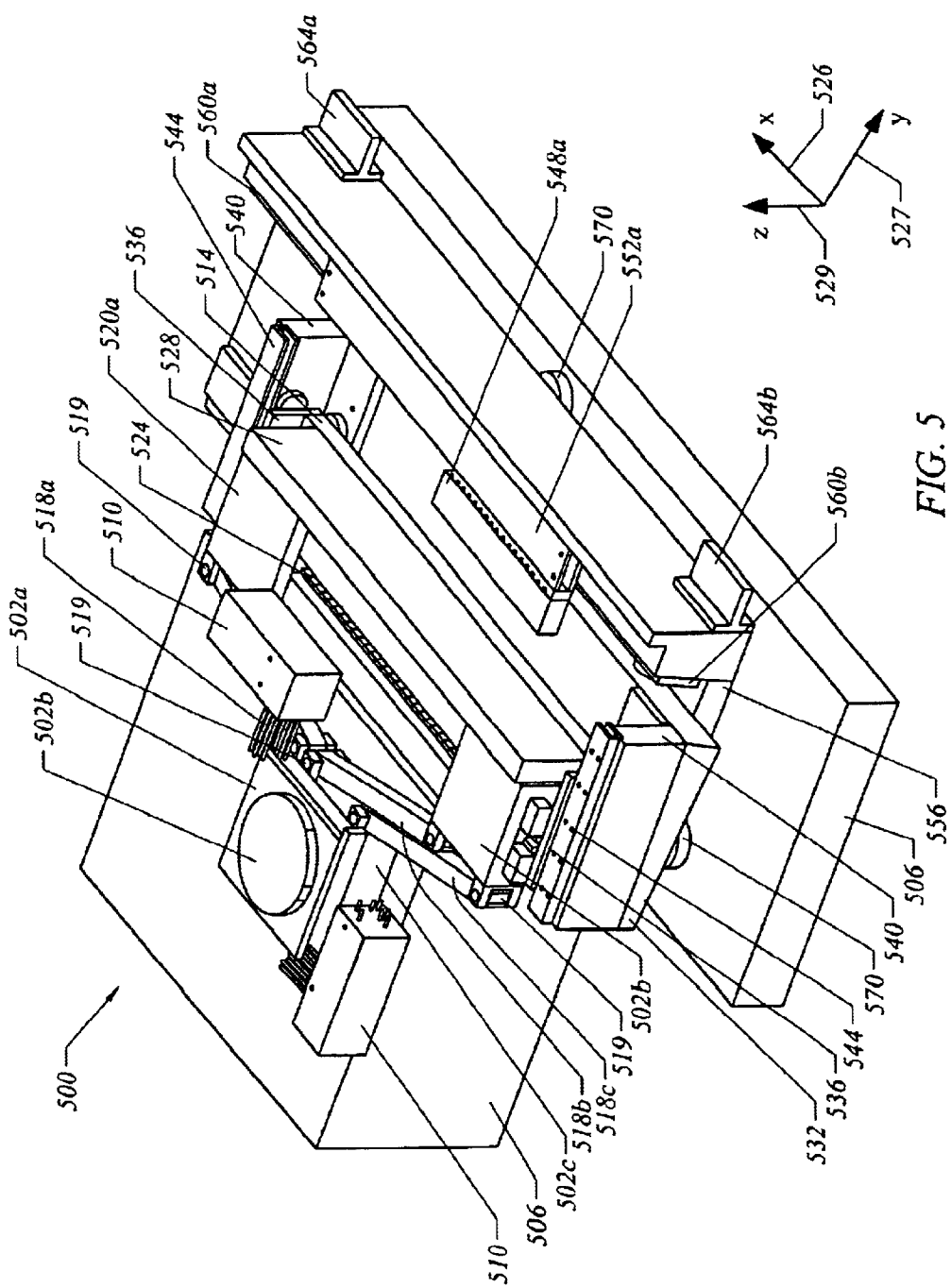
FIG. 5 is a diagrammatic representation of a modular stage device which includes dual actuators on a single magnet track and uses linkages to move a wafer table in accordance with an embodiment of the present invention.

An overall modular stage device that includes a y-stage which carries two actuators that share a common magnet track is shown in FIG. 5. Specifically, FIG. 5 is a diagrammatic representation of a modular stage device which includes dual actuators on a single magnet track and uses linkages to move a wafer table in accordance with an embodiment of the present invention. A modular stage device 500 includes a table assembly 502 which, in the described embodiment, includes a wafer table 502a, a wafer 502b that is supported on wafer table 502a, and a fine stage mechanism 502c which is arranged to allow fine movements of wafer 502b. Table assembly 502 is supported on a base 506. Sensors such as interferometers 510 are arranged to allow a position of wafer 502b to be determined. It should be appreciated that various sensors, e.g., position encoders, which provide position measurements associated with device 500 are not shown for ease of illustration.

Figure 9:
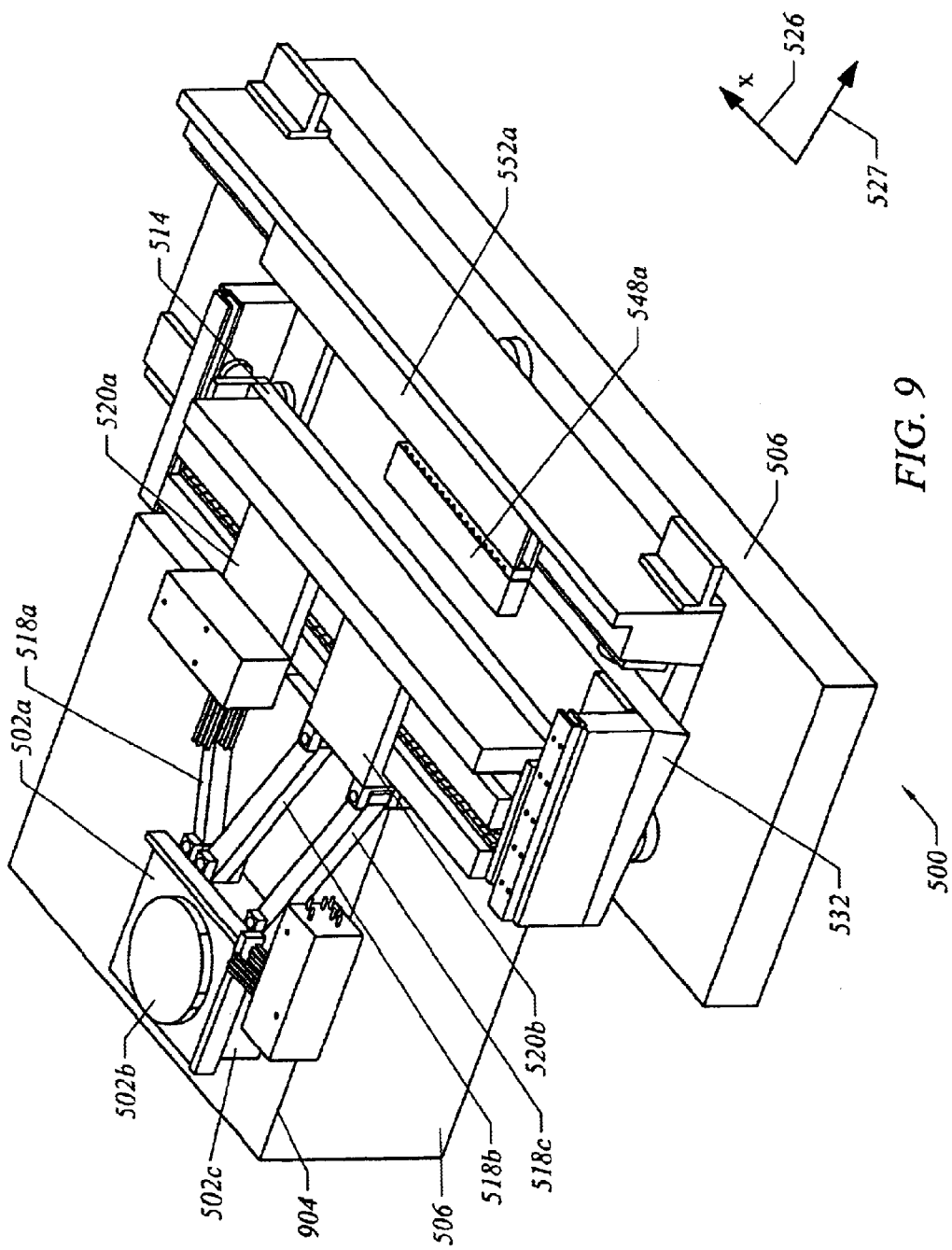
FIG. 9 is a diagrammatic representation of a modular stage device, i.e., stage device 500 of FIG. 5, which includes a table assembly that is at a scan position in which the table assembly is substantially at a maximum location along a y-axis and substantially at a minimum location along an x-axis in accordance with an embodiment of the present invention.

A y-stage 514 is coupled to table assembly 502 through linkages 518. Specifically, linkages 518 are coupled, i.e., through pivots 519, between table assembly 502 and actuators 520 of y-stage 514. Actuators 520, or carriages, include coils, which are positioned under each actuator 520 and between x-guides, such as linear motor coils which are arranged to cooperate with a magnet track 524 to translate along an x-axis 526. As discussed above with respect to FIG. 4b, when actuator 520a and actuator 520b are scanned along x-axis 526 towards each other, table assembly 502 moves in along a y-axis 527 such that table assembly 502 effectively moves further away from actuators 520 as linkages 518 are extended. When actuators 520 have moved as close to each other as possible, a displacement of table assembly 502 may be at a maximum displacement relative to y-axis 527, as shown in FIG. 9.

Y-stage 514 also includes a y-counter mass 528 that is arranged to at least partially absorb reaction forces which are generated when movement of actuators 520 along x-axis 526 causes table assembly 502 to translate along y-axis 527. Y-stage 514 is shown in more detail in FIG. 6. Y-stage 514 is positioned on an x-stage 532 which is effectively a moving platform which serves as a base that guides y-stage 514 when y-stage 514 moves along y-axis 527, as for example when reaction forces from the movement of table assembly 502 along y-axis 527 cause y-stage 514 to move. It should be appreciated that while actuator 520 are arranged to scan along x-axis 526, y-stage 514 as a whole is arranged to move along y-axis 527, i.e., y-stage 514 typically has a single degree of freedom.

Figure 7:
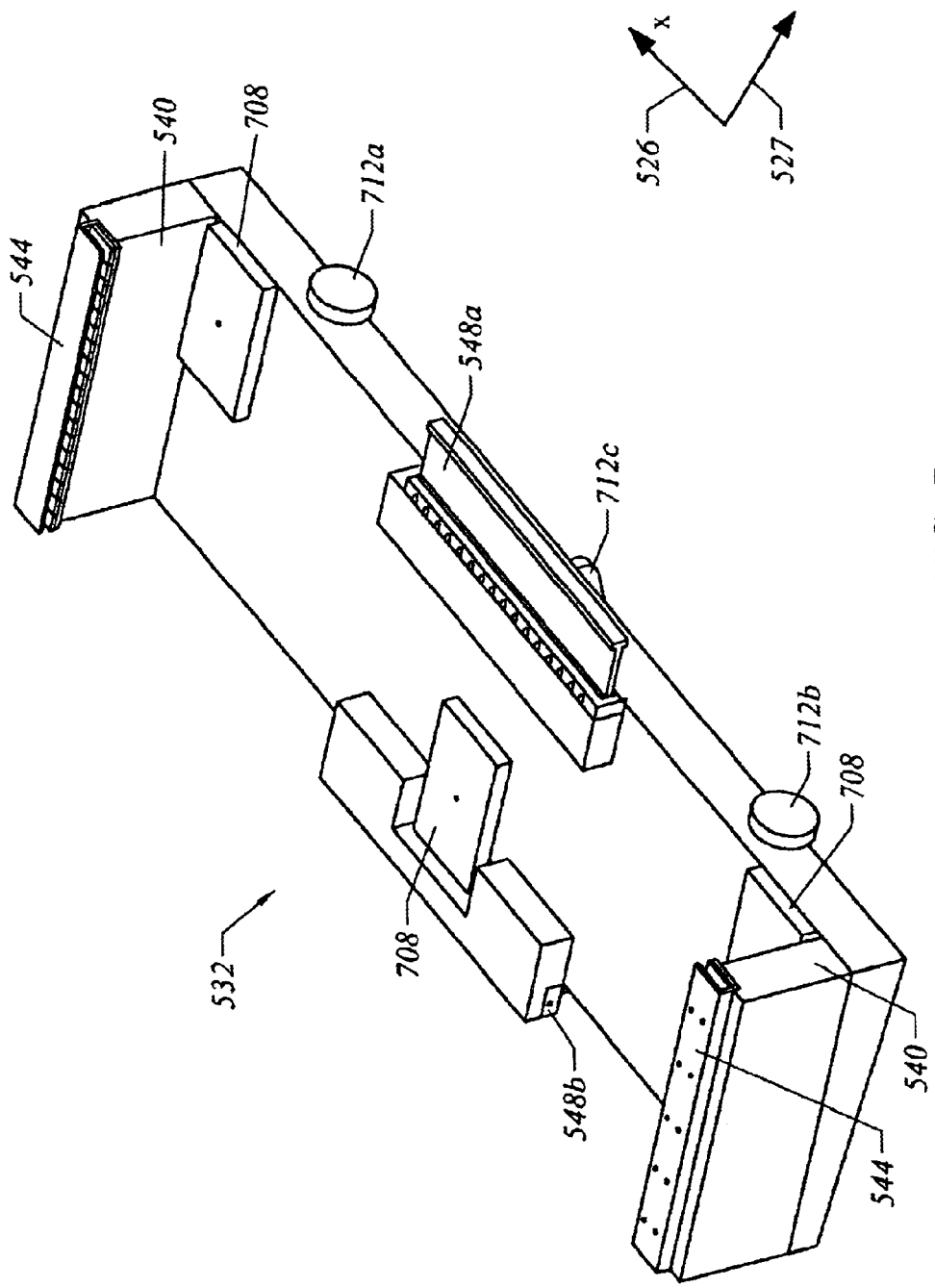
FIG. 7 is a diagrammatic representation of an x-stage, i.e., x-stage 532 of FIG. 5 in accordance with an embodiment of the present invention.

X-stage 532, which is shown in more detail in FIG. 7, includes guides 540 which essentially guide movement of y-stage 514 along y-axis 527. X-stage 532 also includes magnet tracks 544 for y-trim motors 536, which are arranged to generate force along y-axis 527 to move Y-stage 514 along y-axis 527 and to ensure that the center of mass of modular stage device 500 is substantially maintained near a desired or expected position. Like y-stage 514, x-stage 532 generally has a single degree of freedom. In the case of x-stage 532, the single degree of freedom is translation along x-axis 526.

Although actuators 520 may be scanned in the same direction along x-axis 526 to allow table assembly 502 to move along x-axis 526, both x-stage 532 and y-stage 514, which is carried on x-stage 532, may be driven along x-axis 526 to enable table assembly 502 to translate along x-axis 526, as discussed above. X-stage 532 includes x-coils 548 which cooperate with an x-magnet track 552 to enable x-stage 532 to be driven along x-axis 526. X-magnet track 552 is included in an x-counter mass stage 556 which also includes guides 560 that guide x-stage 532 along x-axis 526. In addition to including x-magnet track 552 and guide 560, x-counter mass stage 556 serves as a counter mass which absorbs reaction forces generated when x-stage 532 is driven along x-axis 526. X-trim motors (not shown) may be included on x-counter mass stage 556 to substantially ensure that the center of mass of modular stage device 500 is maintained near a desired or expected position.

X-counter mass stage 556, as shown, includes trim motors 564 which may be used to control rotational motion of table assembly 502, and to effectively ensure that the center of mass of modular stage device 500 is maintained near a desired or expected position. For example, a small position change in trim motor 564a along y-axis 527 while the position of trim motor 564b remains substantially unchanged along y-axis 527 allows a slight rotational motion about a z-axis 529 to be achieved. Bearings 570 positioned on an underside of x-counter mass stage 556 enable x-counter mass stage 556 to have translational motions along x-axis 526 and y-axis 527, while rotational motion may occur about z-axis 529. In one embodiment, bearings 570 may be air bearings.

Figure 6:
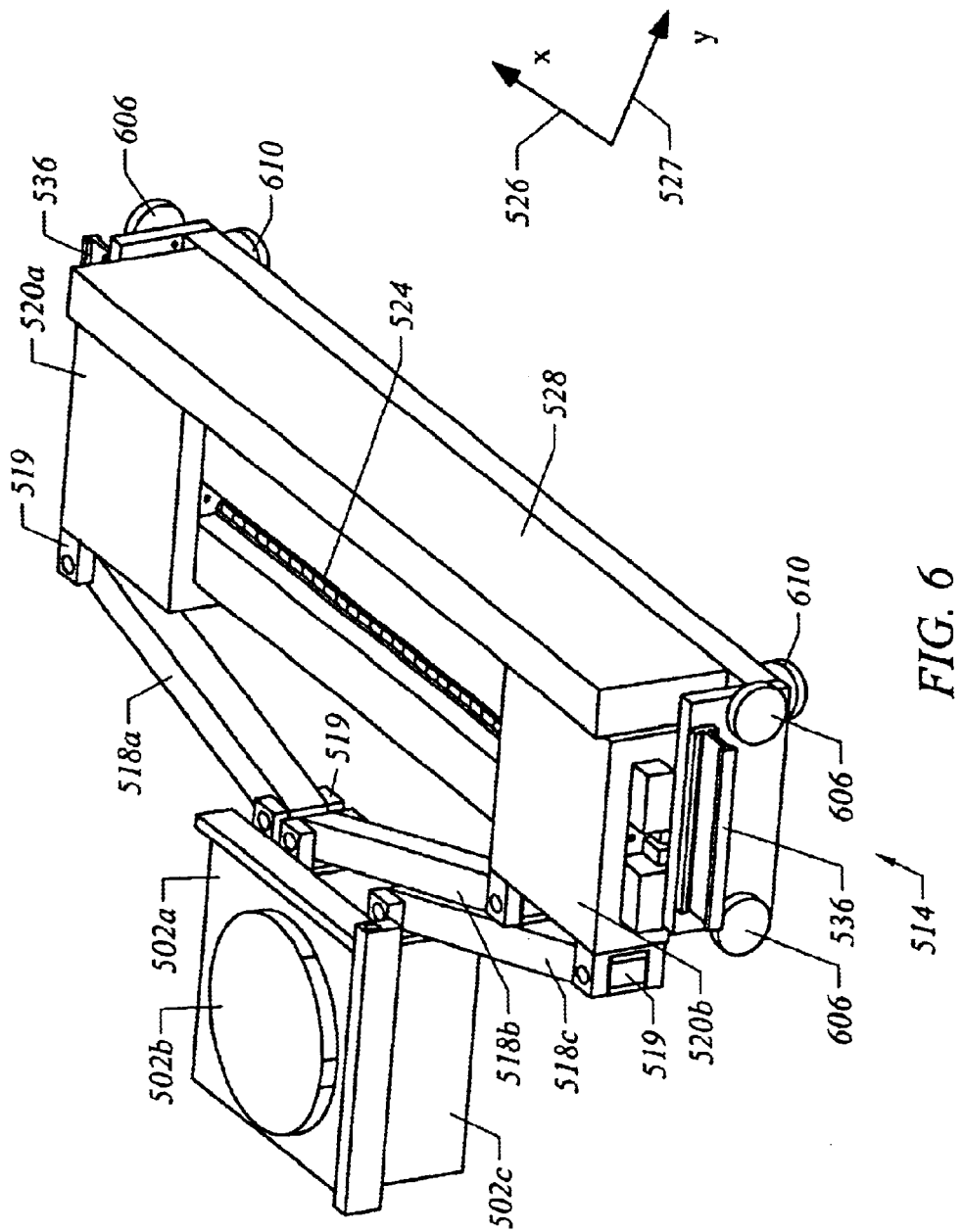
FIG. 6 is a diagrammatic representation of a y-stage, i.e., y-stage 514 of FIG. 5, in accordance with an embodiment of the present invention.

With reference to FIG. 6, the components of y-stage 514 will be described in more detail in accordance with an embodiment of the present invention. Actuators 520, which move with a single degree of freedom, i.e., along x-axis 526, include coils that are located on the underside of actuators 520 or carriages and between x-guides, which cooperate with magnet track 524 to drive table assembly 502. Counter mass 528 absorbs reaction forces which are generated when actuators 520 drive table assembly 502 along y-axis 527. As table assembly 502 is driven along y-axis 527, reaction forces may be such that y-stage 514 at least slightly translates in an opposing direction along y-axis 527. Bearings 606, which are referenced to guides 540 on x-stage 532 of FIG. 5, allow y-stage 514 to slide within x-stage 532. In addition, bearings 610, which are referenced to guides 708 of x-stage 532 as shown in FIG. 7, generally enable y-stage 514 to be slideably positioned atop x-stage 532.

Linkages 518 are pivotably coupled to actuators 520 such that linkages 518 may effectively be extended and retracted closer to actuators 520 depending upon how actuators 520 are moving. Linkages 518 are also pivotably coupled to table assembly 502. As shown, three linkages 518 are coupled to actuators 520, i.e., linkage 518a is coupled to actuator 520a while linkages 518b, 518c are coupled to actuator 520b.

Figure 8:
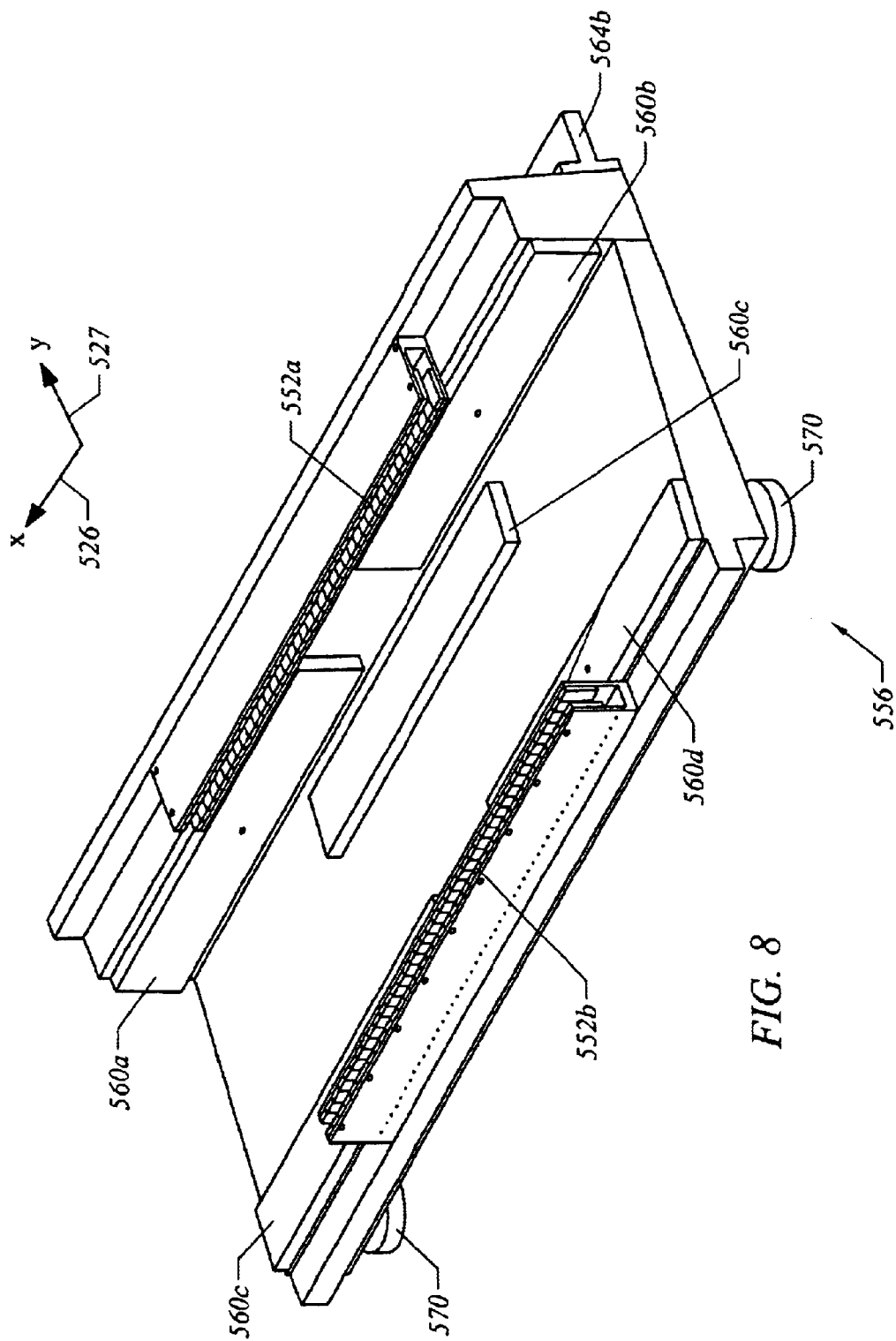
FIG. 8 is a diagrammatic representation of an x-counter mass stage, i.e., x-counter mass stage 556 of FIG. 5 in accordance with an embodiment of the present invention.

When x-stage 532 of FIG. 5 is driven or otherwise translates along x-axis 526, x-stage 532 effectively carries y-stage 514. FIG. 7 is a diagrammatic representation of x-stage 532 of FIG. 5 in accordance with an embodiment of the present invention. X-stage 532 includes coils 548 which are arranged to cooperate with magnet tracks 552 of x-counter mass stage 556, as shown in FIG. 8, to effectively form an actuator to drive x-stage 532 and, hence, table assembly 502 of FIG. 5 along x-axis 526. As x-stage 532 is driven along x-axis 526, reaction forces that are generated as a result of movement along x-axis 526 are generally absorbed by x-counter mass stage 556.

Bearings 712a,b of x-stage 532 are arranged to contact guides or bearing interfaces 560a, b of x-counter mass stage 556, as shown in FIG. 8, such that x-stage 532 may effectively be guided along x-axis 526 when x-stage 532 is driven along x-axis 526. X-counter mass stage 556 also includes guides 560c, d, e with guide bearings 712c that are positioned on an underside of x-stage 532 contact. It should be appreciated that there are other guide bearings which contact guides 560c, d, e which are not shown in FIG. 8. Trim motors 564 of x-counter mass stage 556 or, more specifically, coils of a voice coil motors which are used as a part of trim motors 564, are arranged to allow for some controlled rotational motion. It should be appreciated that, in one embodiment, x-trim motors (not shown) which are arranged to operate in a similar manner as y-trim motors 536, as shown in FIG. 6, may be included on x-counter mass stage 556 to provide trimming capabilities with respect to x-stage 532. Y-trim motors 536 include a first part and a second part that attracts with the first part for generating relative motion therebetween. At least one of the first and second parts is typically attached to x-counter mass stage 556 while the other part may be attached to a fixed portion such as base 506 or a foundation for mounting modular stage device 500.

FIG. 9 is a diagrammatic representation of a modular stage device, i.e., stage device 500 of FIG. 5, which includes a table assembly that is at a scan position in which the table assembly is substantially at a maximum location along a y-axis and substantially at a minimum location along an x-axis in accordance with an embodiment of the present invention. Stage device 500 is arranged such that actuators 520 are effectively separated by a minimum allowable distance within stage device 500. As such, linkages 518 are effectively fully extended to enable table assembly 502 to be located substantially at a maximum distance away from y-stage 514 with along y-axis 527.

Table assembly 502, in addition to being substantially located at a maximum distance away from y-stage 514 along y-axis 527, is located substantially at a minimum allowable distance away from a first edge 904 of base 506 relative to x-axis 526. In order to achieve a substantially minimum distance relative to x-axis 526, coil 548a is positioned within magnet track 552a such that x-stage 532 is effectively unable to be further driven in a negative direction along x-axis 526.

Figure 10:
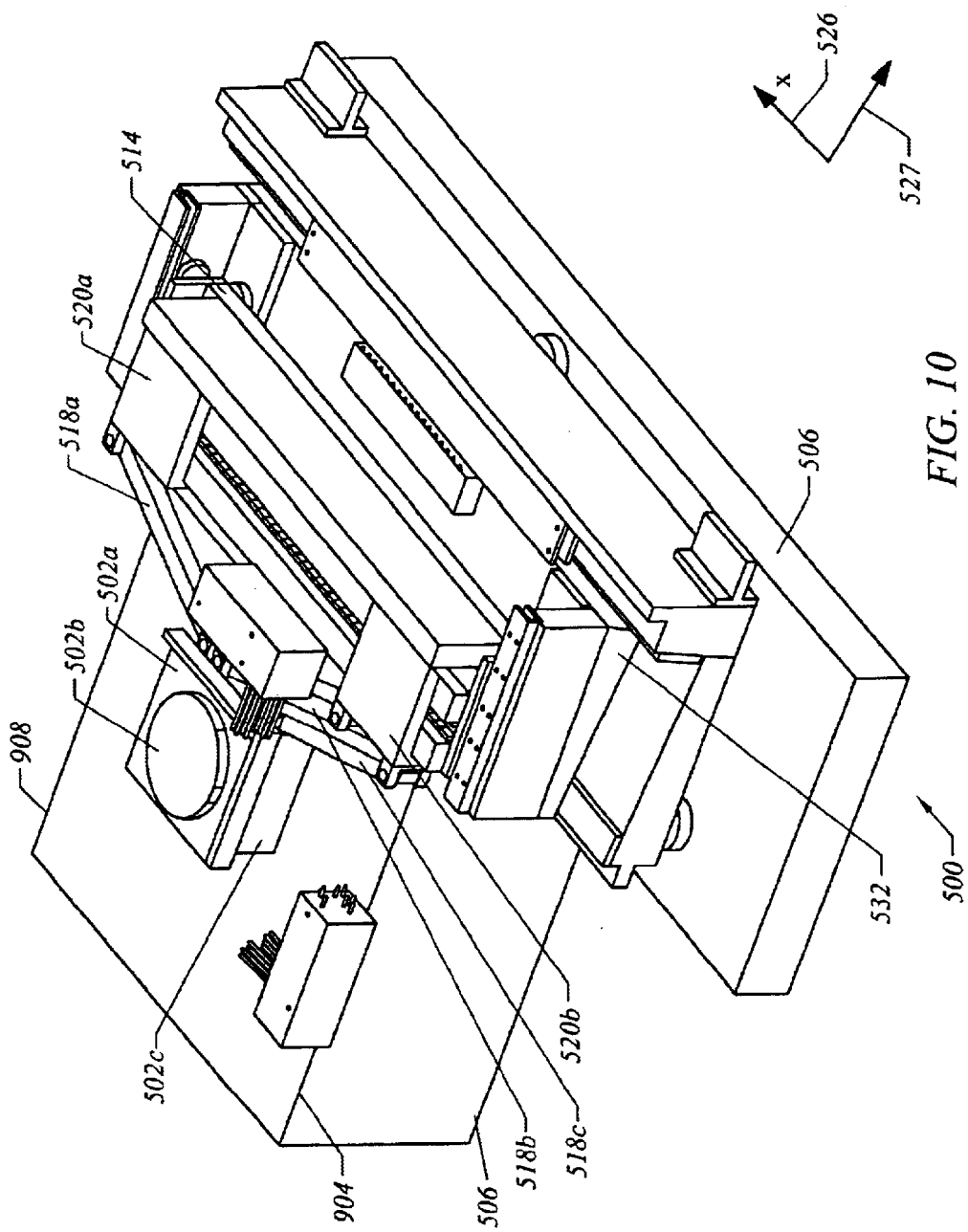
FIG. 10 is a diagrammatic representation of a modular stage device, i.e., stage device 500 of FIG. 5, which includes a table assembly that is at a scan position in which the table assembly is substantially at a minimum location along a y-axis and substantially at a maximum exposure location along an x-axis in accordance with an embodiment of the present invention.

FIG. 10 is a diagrammatic representation of a modular stage device, i.e., stage device 500 of FIG. 5, which includes a table assembly that is at a scan position in which the table assembly is substantially at a minimum location along a y-axis and substantially at a maximum exposure location along an x-axis in accordance with an embodiment of the present invention. Actuators 520 of stage device 500 are essentially located as far away from each other as possible within y-stage 514. Hence, linkages 518 are effectively compressed and relatively unextended. As a result, table assembly 502 is substantially positioned as close to y-stage 514 as possible, and the location of table assembly 502 with respect to y-axis 527 is effectively at a minimum.

As shown, x-stage 532 has been driven along x-axis 526 such that table assembly 502 is approximately at a maximum exposure location with respect to x-axis 526, as measured from first edge 904 of base 506. It should be appreciated that in some embodiments, x-stage 532 may be driven along x-axis 526 even more for wafer loading or wafer alignment purposes.

Figure 11A:
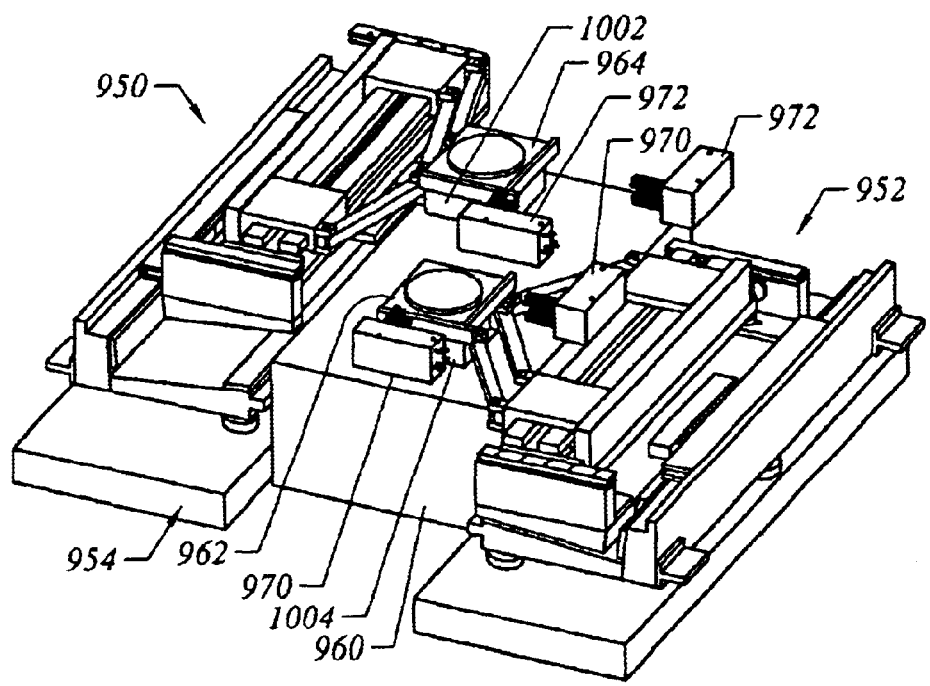
FIG. 11a is a diagrammatic representation of a first twin wafer stage device which includes modular individual stage devices in accordance with an embodiment of the present invention.

In addition to providing relatively high serviceability and accessibility, the modularity of a stage device such as stage device 500 of FIG. 5 also renders the stage device as being particularly suitable for use in a twin wafer stage device. When more than one wafer may be processed at any given time, the throughput associated with a semiconductor fabrication process such as an exposure process or a photolithography process may be improved. For example, when one wafer may be aligned in an alignment area of an exposure apparatus while another wafer is exposed in an exposure area of the exposure apparatus, the time associated with an exposure process may be reduced, as the time that is generally needed to align a wafer may coincide with the exposure time of another wafer. Referring next to FIG. 11a, one embodiment of a twin wafer stage device which includes modular individual stage devices will be described in accordance with an embodiment of the present invention. A twin wafer stage device 950 includes a first modular stage device 952 and a second modular stage device 954. First modular stage device 952 may be substantially the same as stage device 500 of FIG. 5, while second modular stage device 954 may be substantially the same as stage device 500 except that the second modular stage device 954 is effectively rotated approximately 180 degrees from first modular stage device 952. First modular stage device 952 is shown as including interferometers 970 while second modular stage device 954 is shown as including interferometers 972.

Since each modular stage device 952, 954 is arranged such that actuators and magnet tracks of each modular stage device 952, 954 are arranged on one side of each modular stage device 952, 954, it is typically relatively easy to arrange modular stage devices 952, 954 to share a common base 960. That is, a table assembly 962 of modular stage device 952 and a table assembly 964 of modular stage device 954 may be arranged to be positioned substantially atop base 960. It should be appreciated that twin wafer stage device 950 may be included in a photolithography device that is of a structure which does not use a base such as base 960 for support, i.e., base 960 may be optional in some embodiments.

As shown, modular stage devices 952, 954 are uncoupled such that there is relatively minimal cross coupling between modular stage devices 952, 954, but share a common base 960. The modularity of modular stage devices 952, 954 generally enables one of modular stage devices 952, 954 to be removed, e.g., for debugging, without significantly affecting the remaining one of modular stage devices 952, 954. In addition, since base 960 is shared, the footprint of twin wafer stage device 950 is relatively small, thereby allowing two modular stage devices 952, 954 to occupy a relatively small amount of space as compared to two modular stage devices which each have their own associated base and are arranged such that each modular stage device uses only its own associated base.

Each fine stage mechanism 1002, 1004 of modular stage devices 954, 952, respectively, has a driving device (not shown) that moves wafer table assemblies 964, 962, respectively, in up to six degrees of freedom. By way of example, fine stage mechanism 1002 may be arranged such that its associated driving device (not shown) moves table assembly 964 in precisely six degrees of freedom, i.e., table assembly 964 may include a six degree of freedom wafer table.

Generally, a photolithography apparatus which includes twin wafer stage device 950 may have a first area that is arranged for exposing a wafer with a projection optical system and a second area that is arranged for aligning the wafer with an alignment optical device. Both the projection optical system and the alignment optical device are generally arranged substantially over table assemblies 962, 964 such that table assemblies 962, 964 may move wafers beneath the projection optical system and the alignment optical device, or alignment system, as needed. It should be appreciated that once a wafer loader (not shown) is used to load a wafer onto one of table assemblies 962, 964, the wafer is aligned in the first area using the alignment optical device before the wafer is positioned with respect to the projection optical system in the second area. First modular stage device 952 may move table assembly 962 between the first area that is arranged for exposing a wafer and the second are that is arranged for aligning the wafer, and second modular stage device 954 may move table assembly 964 between the first area and the second area.

The measuring devices used to enable the position of wafers on table assemblies 962, 964 to be determined may vary widely. In the embodiment as shown, interferometers 970, 972 are positioned on two sides of each table assembly 962, 964. Alternatively, each table assembly 962, 964 may instead have three mirror members disposed along three sides of each table assembly 962, 964 for measuring the position of the wafer table.

Figure 11B:
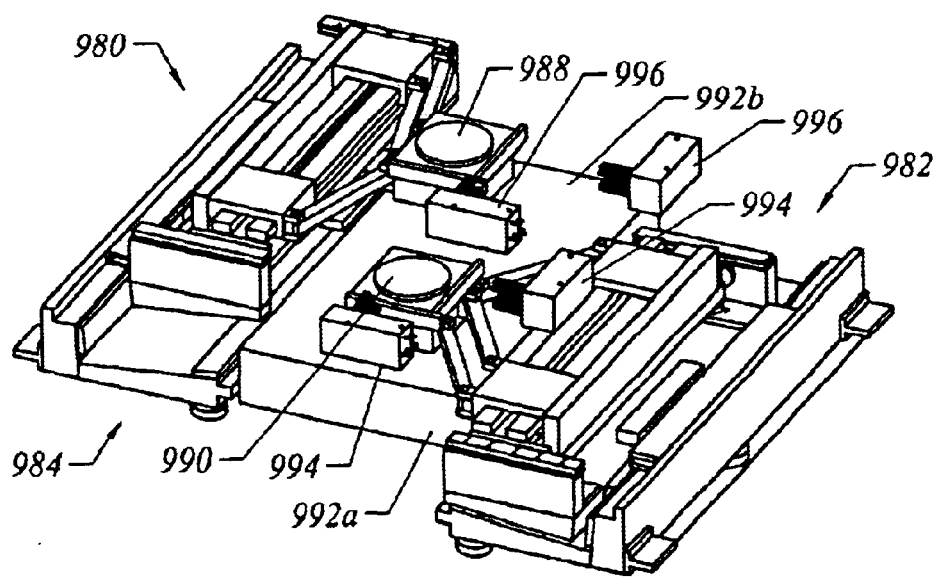
FIG. 11b is a diagrammatic representation of a second twin wafer stage device which includes modular individual stage devices in accordance with an embodiment of the present invention.

In another embodiment of a twin wafer stage device which includes modular individual stage devices, the individual stage devices may effectively have their own bases, but may be arranged such that the table assembly of each stage device may slide over either base. FIG. 11b is a diagrammatic representation of a second twin wafer stage device which includes modular individual stage devices in accordance with an embodiment of the present invention. A twin wafer stage device 980 includes a first modular stage device 982 and a second modular stage device 984. First modular stage device 982 is effectively rotated approximately 180 degrees from second modular stage device 984. The position of each modular stage device 982, 984 may be monitored using interferometers 994, 996, respectively.

Like twin wafer stage device 950 of FIG. 11a, twin wafer stage device 980 is arranged such that actuators and magnet tracks of each modular stage device 982, 984 are arranged on one side of each modular stage device 982, 984. However, each modular stage device 982, 984 of twin wafer stage device 980 has its own base 992. As shown, a modular stage device 982 includes base 992a, while modular stage device 984 includes base 992b. Although bases 992 are generally separate, bases 992 may contact each other. A table assembly 990 of modular stage device 982 and a table assembly 988 of modular stage device 984 are each arranged such that table assemblies 990, 988 may slide over either base. That is, table assembly 990 may slide from base 992a onto base 992b as appropriate, while table assembly 988 may slide from base 992b onto base 992a as appropriate.

Modular stage devices 982, 984 are uncoupled such that there is relatively minimal cross coupling between modular stage devices 982, 984. The modularity of modular stage devices 982, 984 generally enables one of modular stage devices 982, 984 to be removed from twin wafer stage device 980 without significantly affecting the operation of the remaining one of modular stage devices 982, 984. Since table assemblies 988, 990 are effectively arranged to slide on both bases 992, the footprint of twin wafer stage device 950 is relatively small.

Figure 12:
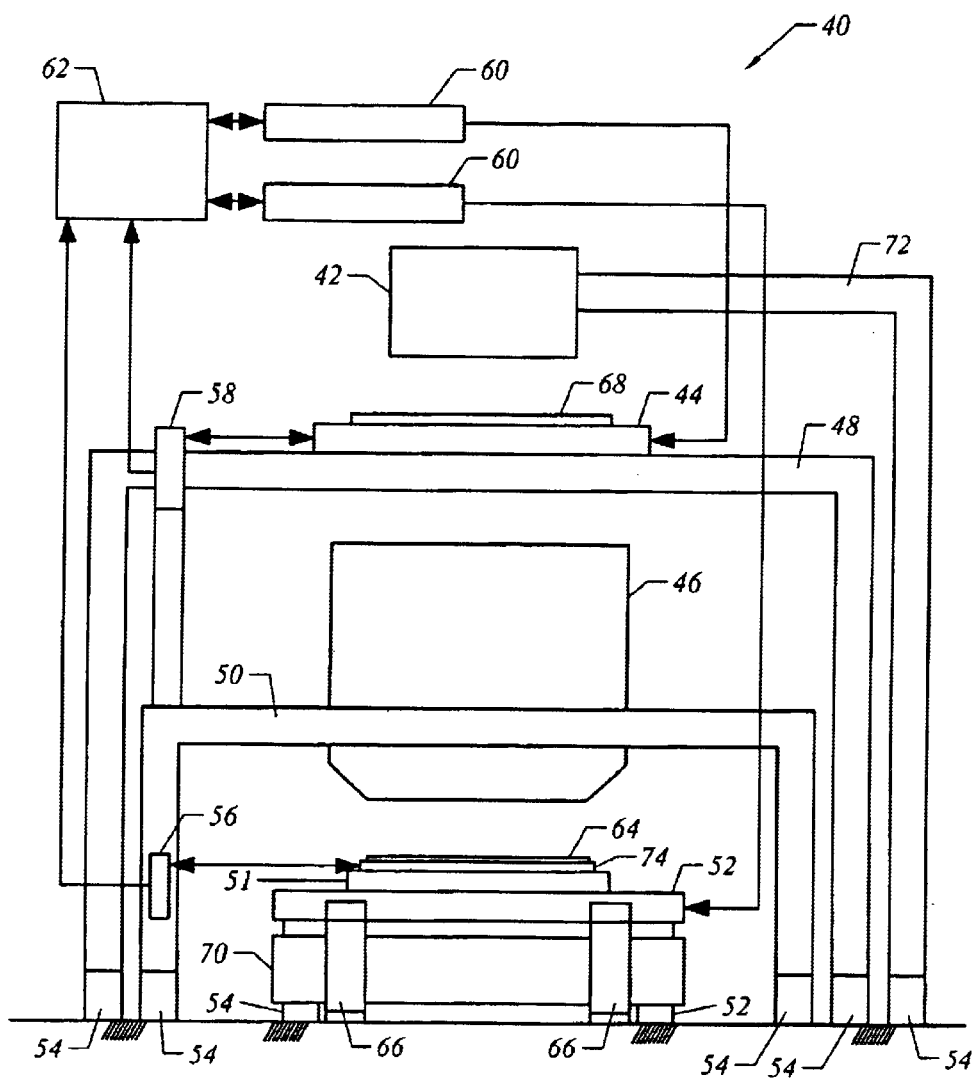
FIG. 12 is a diagrammatic representation of a photolithography apparatus in accordance with an embodiment of the present invention.

With reference to FIG. 12, a photolithography apparatus which may include a modular stage will be described in accordance with an embodiment of the present invention. A photolithography apparatus (exposure apparatus) 40 includes a wafer positioning stage 52 that may be a part of one of modular stage devices 500, 950, 980 shown in FIGS. 3–11b Base 70, which is supported to a ground via isolators 54, may be a base such as base 506 of FIG. 5. In one embodiment, wafer positioning stage 52, wafer holder 74, and base 70 may be part of any one of modular stage devices 500, 950, 980. In general, a wafer 64 held on wafer holder 74 may be moved in up to three degrees of freedom under the control of a control unit 60 and a system controller 62.

An illumination system 42 is supported by a frame 72. Frame 72 is supported to the ground via isolators 54. Illumination system 42 includes an illumination source, and is arranged to project a radiant energy, e.g., light, through a mask pattern on a reticle 68 that is supported by and scanned using a reticle stage 44 which includes a coarse stage and a fine stage. The radiant energy is focused through projection optical system 46, which is supported on a projection optics frame 50 and may be supported the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. In one embodiment, wafer table 51 has a force damper which reduces vibrations associated with wafer table 51 such that interferometer 56 may accurately detect the position of wafer table 51. A second interferometer 58 is supported on projection optical frame 50, and detects the position of reticle stage 44 which supports a reticle 68. Interferometer 58 also outputs position information to system controller 62.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head.

The illumination source of illumination system 42 may be g-line (436 nanometers (nm)), i-line (365 nm), a KrF excimer laser (248 nm), an ArF excimer laser (193 nm), and an $F_2$-type laser (157 nm). Alternatively, illumination system 42 may also use charged particle beams such as x-ray and electron beams. For instance, in the case where an electron beam is used, thermionic emission type lanthanum hexaboride ($LaB_6$) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser is used, glass materials such as quartz and fluorite that transmit far ultra-violet rays is preferably used. When either an $F_2$-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUW) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

Further, in photolithography systems, when linear motors (see U.S. Pat. Nos. 5,623,853 or 5,528,118, which are each incorporated herein by reference in their entireties) are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage which uses no guide.

Alternatively, a wafer stage or a reticle stage may be driven by a planar motor which drives a stage through the use of electromagnetic forces generated by a magnet unit that has magnets arranged in two dimensions and an armature coil unit that has coil in facing positions in two dimensions. With this type of drive system, one of the magnet unit or the armature coil unit is connected to the stage, while the other is mounted on the moving plane side of the stage.

Movement of the stages as described above generates reaction forces which may affect performance of an overall photolithography system. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by the reticle (mask) stage motion may be mechanically released to the floor (ground) by use of a frame member as described in U.S. Pat. No. 5,874,820 and published Japanese Patent Application Disclosure No. 8-330224, which are each incorporated herein by reference in their entireties.

Isolaters such as isolators 54 may generally be associated with an active vibration isolation system (AVIS). An AVIS generally controls vibrations associated with forces, i.e., vibrational forces, which are experienced by a stage assembly or, more generally, by a photolithography machine such as photolithography apparatus 40 which includes a stage assembly.

A photolithography system according to the above-described embodiments, e.g., a photolithography apparatus which may include one or more dual force actuators, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 13:
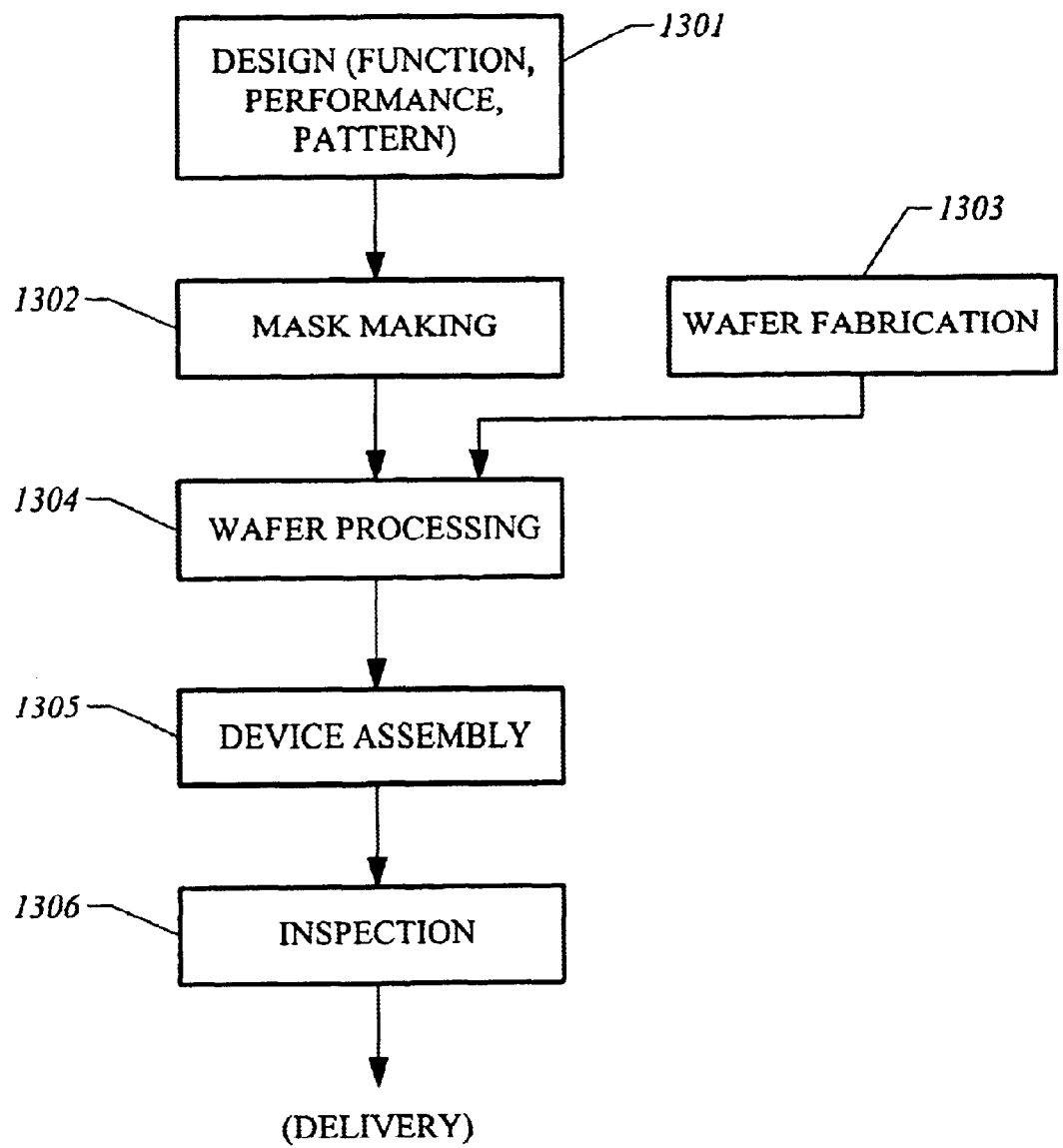
FIG. 13 is a process flow diagram which illustrates the steps associated with fabricating a semiconductor device in accordance with an embodiment of the present invention.

Further, semiconductor devices may be fabricated using systems described above, as will be discussed with reference to FIG. 13. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system. One process of exposing a mask pattern onto a wafer will be described below with respect to FIG. 14. In step 1305, the semiconductor device is assembled. The assembly of the semiconductor device generally includes, but is not limited to, wafer dicing processes, bonding processes, and packaging processes. Finally, the completed device is inspected in step 1306.

Figure 14:
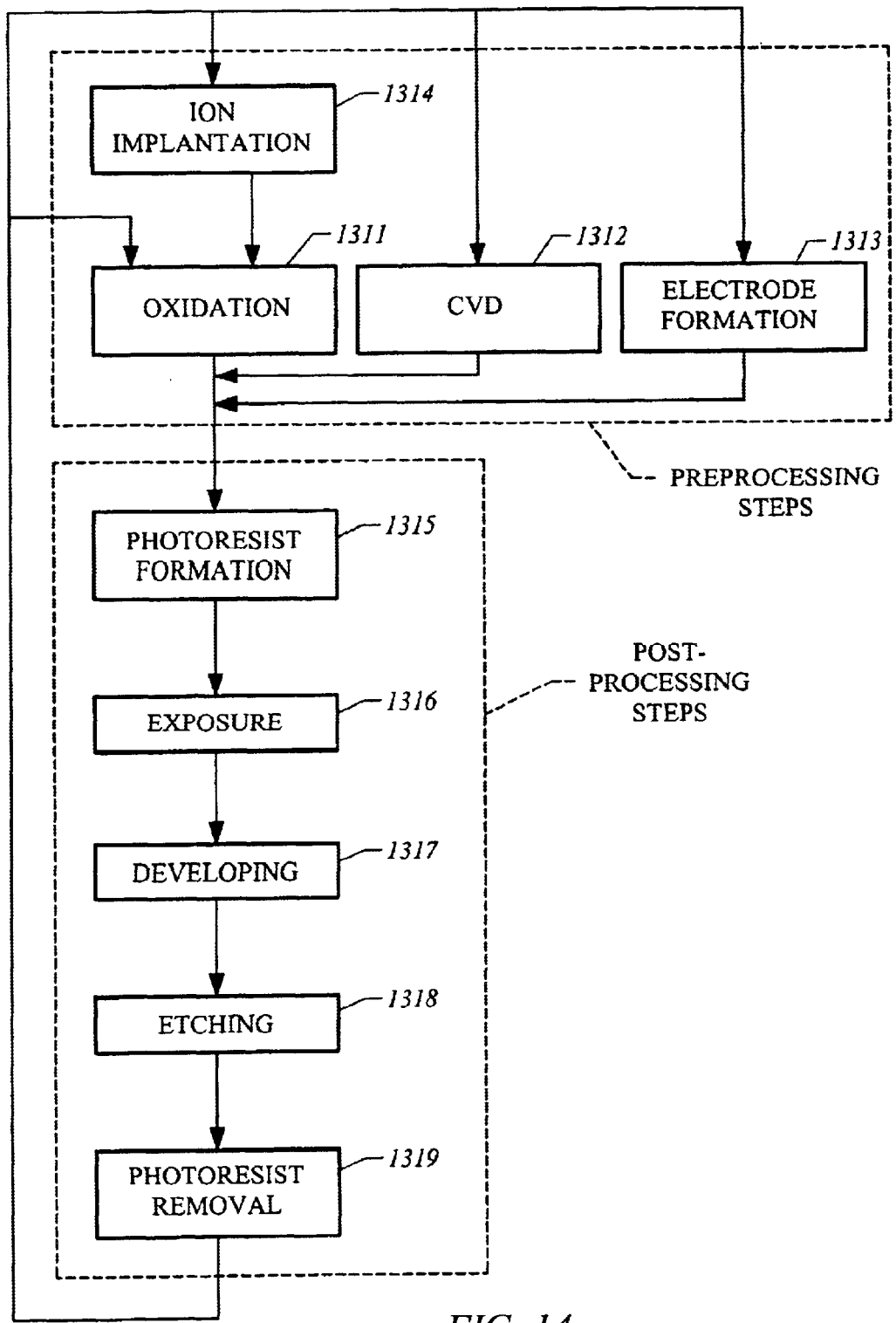
FIG. 14 is a process flow diagram which illustrates the steps associated with processing a wafer, i.e., step 1304 of FIG. 13, in accordance with an embodiment of the present invention.

FIG. 14 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 1313, electrodes are formed on the wafer by vapor deposition. Then, ions may be implanted in the wafer using substantially any suitable method in step 1314. As will be appreciated by those skilled in the art, steps 1311–1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1317. Once the exposed wafer is developed, parts other than residual photoresist, e.g., the exposed material surface, may be removed by etching. Finally, in step 1319, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, although the use of a modular stage device has been described as being suitable for use as a coarse stage, a modular stage device may also be used or adapted for use as a fine stage. In addition, while a modular stage device has been described as being used as a wafer stage, the modular stage device may instead be used as a reticle stage.

Generally, when coarser movements are desired in an x-direction, an x-stage is driven to enable a wafer table to be scanned in the x-direction. As discussed above, when movements that are less coarse are desired, actuators on a y-stage may be used to scan the wafer table in the x-direction. In one embodiment, the actuators and the x-stage may both be used to control the amount by which the wafer table is scanned in the x-direction.

While a y-stage has been described as having a single magnet track, the y-stage may instead have more than one magnet track, e.g., one magnet track for each actuator or carriage associated with the y-stage. Also, instead of having three linkages that are coupled between two actuators and a table assembly, the three linkages may instead be coupled between three actuators and the table assembly. The use of three actuators where two of the actuators move in the same direction, but possibly at different rates, while one actuator moves in the opposite direction generally also enables a wafer table to be moved along a y-axis. In addition, in one embodiment, the use of three actuators may enable at least a slight rotational motion of a table assembly with respect to a z-axis as a result of actuating the three actuators. Hence, the use of three actuators or carriages may allow for three degrees of freedom, e.g., two translational and one rotational, to be achieved.

The actuators and motors utilized in the embodiments are not limited to the types disclosed above and may, instead, be substantially any type of suitable actuator. Suitable actuators include, but are not limited to, linear motors and voice coil motors which use a Lorentz force for driving, electromagnet-type actuators, and rotary motors. A non-contacting type actuator is typically preferred in the present invention. Further, bearings used in the embodiments discussed above may be substantially any suitable type of bearing, e.g., an air bearing or a magnetic type bearing.

The present invention has generally been described as being a stage apparatus which has three degrees of freedom. In other words, a stage device has been described as being arranged to move a wafer translationally along an x-axis and a y-axis, and rotationally about a z-axis. It should be appreciated, however, that a stage apparatus may generally be arranged to have more than three degrees of freedom, e.g., up to approximately eight degrees of freedom, without departing from the spirit or the scope of the present invention. Therefore, the present examples are to be considered as illustrative and not restrictive, and the invention is not to be limited to the details given herein, but may be modified within the scope of the appended claims.

What is claimed is:

1. A stage apparatus comprising:
a table assembly, the table assembly being arranged to support an object to be moved; and
a first stage, the first stage including a counter mass arrangement, a plurality of carriages, and a plurality of linkages, the plurality of carriages being coupled to the table assembly through the plurality of linkages, wherein a first carriage of the plurality of carriages and a second carriage of the plurality of carriages are arranged to move in substantially opposite directions along a first axis to cause the table assembly to move along a second axis while reaction forces generated by the first carriage and the second carriage are substantially cancelled by the counter mass arrangement.

2. The stage apparatus of claim 1 further including:
a second stage, the second stage being arranged to substantially carry the first stage, the second stage further being arranged to cause the first stage to move along the first axis to cause the table assembly to move along the first axis by substantially driving the first stage through a center of gravity of the first stage.

3. The stage apparatus of claim 2 further including:
a first counter mass, the first counter mass being arranged to substantially support the second stage and to substantially absorb reaction forces generated when the second stage causes the first stage to move along the first axis.

4. The stage apparatus of claim 3 wherein the second stage and the first counter mass are substantially coupled by an actuator which enables the second stage to move along the first axis to cause the first stage to move along the first axis.

5. The stage apparatus of claim 3 wherein the first counter mass is coupled to a plurality of trim motors, the plurality of trim motors being arranged to cooperate to cause the table assembly to rotate about a third axis.

6. The stage apparatus of claim 1 wherein the first stage further includes a first magnet track, wherein the plurality of carriages is arranged to move along the first magnet track.

7. The stage apparatus of claim 1 wherein the counter mass arrangement includes a second counter mass, the second counter mass being arranged to substantially absorb the reaction forces generated when the table assembly is moved along the second axis.

8. The stage apparatus of claim 1 wherein the first carriage and the second carriage are arranged to move in substantially a same direction along the first axis to cause the table assembly to move along the first axis.

9. The stage apparatus of claim 1 wherein the first carriage is coupled to the table assembly through a first linkage of the plurality of linkages and the second carriage is coupled to the table assembly through a second linkage and a third linkage of the plurality of linkages.

10. An exposure apparatus comprising the stage apparatus of claim 1.

11. A device manufactured with the exposure apparatus of claim 10.

12. A wafer on which an image has been formed by the exposure apparatus of claim 10.

13. A scanning stage device comprising:
a table, the table being arranged to support an object;
a fine stage assembly, the fine stage assembly being arranged to carry the table; and
a coarse stage assembly, the coarse stage assembly including a first stage and a second stage, the first stage including a first carriage and a second carriage that are coupled to the fine stage assembly through a plurality of linkages, the second stage being arranged to substantially support the first stage and to move the first stage along a first axis through approximately a center of gravity of the first stage to move the fine stage assembly along the first axis, wherein the first carriage and the second carriage are arranged to be driven in substantially opposite directions along the first axis to move the fine stage assembly along a second axis.

14. The scanning stage device of claim 13 wherein the coarse stage assembly further includes a first counter mass, the first counter mass being arranged to substantially absorb reaction forces generated when the second stage moves the first stage along the first axis.

15. The scanning stage device of claim 14 wherein the first counter mass is arranged to support the second stage and includes a plurality of trim motors, the trim motors being arranged to be actuated to cause the fine stage assembly to rotate about a third axis.

16. The scanning stage device of claim 13 wherein the first stage includes a second counter mass, the second counter mass being arrange to substantially absorb reaction forces generated when the first carriage and the second carriage move the fine stage assembly along the second axis.

17. The scanning stage device of claim 13 wherein the first stage includes a first magnet track and the first carriage and the second carriage are arranged to move over the first magnet track.

18. The scanning stage device of claim 13 wherein the first carriage and the second carriage are further arranged to be driven in substantially a same direction along the first axis to move the fine stage assembly along the first axis.

19. The scanning stage device of claim 13 wherein a first linkage of the plurality of linkages is pivotably coupled between the fine stage assembly and the first carriage, and wherein a second linkage and a third linkage of the plurality of linkages are pivotably coupled between the fine stage assembly and the second carriage.

20. An exposure apparatus comprising the scanning stage device of claim 13.

21. A device manufactured with the exposure apparatus of claim 20.

22. A wafer on which an image has been formed by the exposure apparatus of claim 20, wherein the wafer is the object supported on the table.

23. A method of positioning an object, the object being supported by a table assembly of a stage device, the table assembly being coupled to a first actuator and a second actuator through a plurality of linkages that are pivotably coupled to the first actuator and the second actuator, the first actuator and the second actuator being included on a stage of the stage device, the method comprising:

determining when the object is to be moved along a first axis;

driving the first actuator and the second actuator in substantially opposite directions along a second axis to move the object along the first axis when it is determined that the object is to be moved along the first axis, wherein driving the first actuator and the second actuator causes the linkages that are pivotably coupled to the first actuator and the second actuator to move the table assembly;

determining when the object is to be moved along the second axis; and driving the stage along the second axis to move the object along the second axis when it is determined that the object is to be moved along the second axis.

24. The method of claim 23 further including:

determining when the object is to be moved along a first axis;

determining when the object is to be moved about a third axis; and driving the first stage device about the third axis to move the object about the third axis when it is determined that the object is to be moved about the third axis.

25. A method for operating an exposure apparatus comprising the method for positioning of claim 23.

26. A method for making an object including at least a photolithography process, wherein the photolithography process utilizes the method of operating an exposure apparatus of claim 25.

27. A method for making a wafer utilizing the method of operating an exposure apparatus of claim 25.

28. A method of positioning an object, the object being supported by a table assembly of a stage device, the table assembly being coupled to a first actuator and a second actuator through a plurality of linkages that are pivotably coupled to the first actuator and the second actuator, the method comprising:

determining when the object is to be moved along a first axis;

driving the first actuator and the second actuator in substantially opposite directions along a second axis to move the object along the first axis when it is determined that the object is to be moved along the first axis, wherein driving the first actuator and the second actuator causes the linkages that are pivotably coupled to the first actuator and the second actuator to move the table assembly;

determining when the object is to be moved along the second axis; and driving the first actuator and the second actuator in substantially the same direction along the second axis to move the object along the second axis when it is determined that the object is to be moved along the second axis.

29. The method of claim 28 wherein the first actuator and the second actuator are included on a stage device, the method including:

determining when the object is to be moved about a third axis; and driving the stage device about the third axis to move the object about the third axis when it is determined that the object is to be moved about the third axis.

30. A method for operating an exposure apparatus comprising the method for positioning of claim 28.

31. A method for making an object including at least a photolithography process, wherein the photolithography process utilizes the method of operating an exposure apparatus of claim 30.

32. A method for making a wafer utilizing the method of operating an exposure apparatus of claim 30.

33. A stage apparatus comprising:

a first table assembly, the first table assembly being arranged to support a first object to be moved;

a second table assembly, the second table assembly being arranged to support a second object to be moved;

a first stage, the first stage including a first counter mass arrangement, a first plurality of carriages, and a first plurality of linkages, the first plurality of linkages being pivotably coupled to the first table assembly through the first plurality of linkages, wherein a first carriage of the first plurality of carriages and a second carriage of the first plurality of carriages are arranged to move in substantially opposite directions along a first axis to cause the first table assembly to move along a second axis while reaction forces generated when the first carriage of the first plurality of carriages and the second carriage of the first plurality of carriages are substantially cancelled by the first counter mass arrangement; and a second stage, the second stage including a second counter mass arrangement, a second plurality of carriages, and a second plurality of linkages, the second plurality of carriages being pivotably coupled to the second table assembly through the second plurality of linkages, wherein a first carriage of the second plurality of carriages and a second carriage of the second plurality of carriages are arranged to move in substantially opposite directions along a first axis to cause the second table assembly to move along a second axis while reaction forces generated when the first carriage of the second plurality of carriages and the second carriage of the second plurality of carriages are substantially cancelled by the second counter mass arrangement.

34. The stage apparatus of claim 33 further including:

a third stage, the third stage being arranged to substantially carry the first stage, the third stage further being arranged to cause the first stage to move along the second axis to cause the first table assembly to move along the second axis by substantially driving the first stage through a center of gravity of the first stage.

35. The stage apparatus of claim 34 further including:

a first counter mass, the first counter mass being arranged to substantially support the third stage and to substantially absorb reaction forces generated when the third stage causes the first stage to move along the second axis.

36. The stage apparatus of claim 34 further including:

a fourth stage, the fourth stage being arranged to substantially carry the second stage, the fourth stage further being arranged to cause the second stage to move along the second axis to cause the second table assembly to move along the second axis by substantially driving the second stage through a center of gravity of the second stage.

37. The stage apparatus of claim 36 further including:

a second counter mass, the second counter mass being arranged to substantially support the fourth stage and to substantially absorb reaction forces generated when the fourth stage causes the second stage to move along the second axis.

38. The stage apparatus of claim 33 wherein the first stage further includes a first magnet track and the second stage further includes a second magnet track, wherein the first plurality of carriages is arranged to move along the first magnet track and the second plurality of carriages is arranged to move along the second magnet track.

39. An exposure apparatus comprising the stage apparatus of claim 33.

40. A device manufactured with the exposure apparatus of claim 39.

41. A wafer on which an image has been formed by the exposure apparatus of claim 39.

42. A photolithography apparatus comprising the stage apparatus of claim 33.

43. A method of positioning an object, the object being supported by a table assembly of a stage device, the table assembly being coupled to a first actuator and a second actuator, the first actuator and the second actuator being included on a stage of the stage device, the method comprising:

determining when the object is to be moved along a first axis;

driving the first actuator and the second actuator in substantially opposite directions along a second axis to move the object along the first axis when it is determined that the object is to be moved along the first axis;

determining when the object is to be moved along the second axis;

driving the stage along the second axis to move the object along the second axis when it is determined that the object is to be moved along the second axis;

determining when the object is to be moved about a third axis; and driving the first stage device about the third axis to move the object about the third axis when it is determined that the object is to be moved about the third axis.

44. A method of positioning an object, the object being supported by a table assembly of a stage device, the table assembly being coupled to a first actuator and a second actuator, wherein the first actuator and the second actuator are included on a stage device, the method including:

determining when the object is to be moved along a first axis;

driving the first actuator and the second actuator in substantially opposite directions along a second axis to move the object along the first axis when it is determined that the object is to be moved along the first axis;

determining when the object is to be moved along the second axis; and driving the first actuator and the second actuator in substantially the same direction along the second axis to move the object along the second axis when it is determined that the object is to be moved along the second axis;

determining when the object is to be moved about a third axis; and driving the stage device about the third axis to move the object about the third axis when it is determined that the object is to be moved about the third axis.

45. A stage apparatus comprising:

a first table assembly, the first table assembly being arranged to support a first object to be moved;

a second table assembly, the second table assembly being arranged to support a second object to be moved;

a first stage, the first stage including a first counter mass arrangement, a first plurality of carriages, and a first plurality of linkages, the first plurality of carriages being coupled to the first table assembly through the first plurality of linkages, wherein a first carriage of the first plurality of carriages and a second carriage of the first plurality of carriages are arranged to move in substantially opposite directions along a first axis to cause the first table assembly to move along a second axis while reaction forces generated when the first carriage of the first plurality of carriages and the second carriage of the first plurality of carriages are substantially cancelled by the first counter mass arrangement;

a second stage, the second stage including a second counter mass arrangement, a second plurality of carriages, and a second plurality of linkages, the second plurality of carriages being coupled to the second table assembly through the second plurality of linkages, wherein a first carriage of the second plurality of carriages and a second carriage of the second plurality of carriages are arranged to move in substantially opposite directions along a first axis to cause the second table assembly to move along a second axis while reaction forces generated when the first carriage of the second plurality of carriages and the second carriage of the second plurality of carriages are substantially cancelled by the second counter mass arrangement; and a third stage, the third stage being arranged to substantially carry the first stage, the third stage further being arranged to cause the first stage to move along the second axis to cause the first table assembly to move along the second axis by substantially driving the first stage through a center of gravity of the first stage.

* * * * *